(12) United States Patent
Kaneko et al.

(10) Patent No.: US 8,647,795 B2
(45) Date of Patent: Feb. 11, 2014

(54) SPUTTERING TARGET MATERIAL, SILICON-CONTAINING FILM FORMING METHOD, AND PHOTOMASK BLANK

(75) Inventors: Hideo Kaneko, Niigata (JP); Yokio Inazuki, Niigata (JP); Hiroki Yoshikawa, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 178 days.

(21) Appl. No.: 13/273,656

(22) Filed: Oct. 14, 2011

(65) Prior Publication Data

US 2012/0100467 A1 Apr. 26, 2012

(30) Foreign Application Priority Data

Oct. 22, 2010 (JP) .................................. 2010-237114

(51) Int. Cl.
*G03F 1/60* (2012.01)
*C23C 14/00* (2006.01)

(52) U.S. Cl.
USPC .......................................... 430/5; 204/192.1

(58) Field of Classification Search
USPC .............................. 430/5; 204/298.13, 192.15
See application file for complete search history.

(56) References Cited

U.S. PATENT DOCUMENTS

| 2002/0192933 A1* | 12/2002 | Nakata et al. ................. 438/592 |
| 2003/0042545 A1 | 3/2003 | Voutsas et al. |
| 2005/0186485 A1 | 8/2005 | Yoshikawa et al. |

FOREIGN PATENT DOCUMENTS

| JP | 7-6972 | 1/1995 |
| JP | 7-94431 A | 4/1995 |
| JP | 7-140635 | 6/1995 |
| JP | 8-12316 A | 1/1996 |
| JP | 2001-60553 A | 3/2001 |
| JP | 2002-72443 | 3/2002 |
| JP | 2002-162727 | 6/2002 |
| JP | 2003-158138 A | 5/2003 |
| JP | 2003-322955 | 11/2003 |
| JP | 2004-301993 | 10/2004 |
| JP | 2005-234209 A | 9/2005 |
| JP | 2007-241060 | 9/2007 |
| JP | 2007-241065 | 9/2007 |
| JP | 2008-96891 A | 4/2008 |
| JP | 2009-504915 | 2/2009 |

OTHER PUBLICATIONS

Extended Search Report issued Jan. 19, 2012 in European Patent Application No. 11186104.3-1215.
P.S. Nayar, "Refractive index control of Silicon nitride films prepared by radio-frequency reactive sputtering", Journal of Vacuum Science and Technology Part A, AVS/AIP, XP012006254, vol. 20, No. 6, Nov. 1, 2002, pp. 2137-2139.
Office Action issued Jun. 4, 2013, in Japanese Patent Application No. 2010-237114.

\* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

Provided is a silicon target material in which particles are not easily generated during a sputtering process and to form a low-defect (high quality) silicon-containing film. A silicon target material having a specific resistance of 20 $\Omega$·cm or more at room temperature is used for forming a silicon-containing film. The silicon target material may be polycrystalline or noncrystalline. However, when the silicon target material is single-crystalline, a more stable discharge state can be obtained. Also, a single-crystal silicon in which crystals are grown by an FZ method is a preferable material as a highly-pure silicon target material because its content of oxygen is low. Further, a target material having n-type conductivity and containing donor impurities is preferable to obtain stable discharge characteristics. Only a single or a plurality of silicon target materials according to the present invention may be used for sputtering film formation of the silicon-containing film.

5 Claims, No Drawings

SPUTTERING TARGET MATERIAL, SILICON-CONTAINING FILM FORMING METHOD, AND PHOTOMASK BLANK

CROSS REFERENCES TO RELATED APPLICATIONS

This application claims priority to Japanese Patent Application No. 2010-237114 filed on Oct. 22, 2010.

BACKGROUND OF THE INVENTION

1. Field of the Invention

The present invention relates to a technique for forming a silicon-containing film. More specifically, the present invention relates to a sputtering target material for forming a silicon-containing film, a method for forming a high-quality silicon-containing film using the same, and a photomask having the high-quality silicon-containing film.

2. Description of the Related Art

Recent years, in the field of semiconductor processing technology, the technology for miniaturization of a wiring pattern to constitute a circuit and miniaturization of a contact hole pattern for inter-layer wiring to constitute a cell has been increasingly desired because of miniaturization of a circuit pattern due to higher integration of large-scale integrated circuits. To meet such a demand, the wavelength of an exposure light used for photolithography is shortened from an i-line (365 nm) to a KrF excimer laser (248 nm). An ArF excimer laser (193 nm) is used for leading-edge industrial processing.

In the normally-used photolithography, a photopattern is formed by passing a light generated by a light source through a photomask, irradiating it to a resist film, and performing a pattern exposure on the resist film formed to process a substrate to be processed. At this time, the photomask is used for forming the above-described minute patterns and is further used as an original drawing for processing patterns. Accordingly, the photomask is required to have extremely high accuracy. Thus, a film for constituting a blank (photomask blank) used for manufacturing a photomask is required to be a film having high processing accuracy and extremely low defects.

As a material for a light-shielding film which is one of composition elements of the photomask blank, a silicon-based material from which a film having high processing accuracy can be easily obtained has started drawing attention. The silicon-based material has been conventionally used as a material for forming a halftone phase shift film in manufacturing a halftone phase shift mask (see Japanese Patent Laid-Open No. 7-140635). An optical film formed from the silicon-based material containing nitrided or oxidized molybdenum has high controllability of light transmission characteristics. Further, high processing accuracy can be easily obtained.

As compared with a chromium-based material conventionally used for forming the light-shielding film, such a silicon-based material has excellent light-shielding characteristics for an exposure light of 200 nm or less and can be processed by fluorine dry etching which does not easily damage a resist pattern (see Japanese Patent Laid-Open No. 2007-241065).

Also, a silicon-based material film has an advantage in combining a technique for using an etching mask for processing with higher accuracy. In other words, the light-shielding film of the silicon-based material is processed using the chromium-based material as an etching mask, a processing error due to pattern dependency or side etching can be reduced as compared with when the light-shielding film of the chromium-based material is processed using the silicon-based material as an etching mask (see Japanese Patent Laid-Open No. 2007-241060). Thus, the light-shielding film of the silicon-based material has shown great promise as the next generation of the light-shielding film instead of the conventional light-shielding film of the chromium-based material.

For forming a silicon-based material film, a sputtering target of the silicon-based material is usually used. As the sputtering target of such a silicon-based material, a stand-alone silicon (see Japanese Patent Laid-Open No. 2004-301993), a silicon-based target containing a transition metal used for forming a silicon-based material film containing the transition metal are used. When a sputtering target of the stand-alone silicon is used for forming a film, particles are generated during a sputtering process because the electrical conductivity of the target material is low and therefore particle defects are easily formed on the obtained optical film.

Some techniques for suppressing the occurrence of particles from the sputtering target of the stand-alone silicon have been suggested. For example, Japanese Patent Laid-Open No. 2002-72443 suggests using a sputtering target of a single-crystal silicon. Japanese Patent Laid-Open No. 2003-322955 suggests using a sputtering target of which a specific resistance is lowered by adding donor impurities or acceptor impurities in a stand-alone silicon.

SUMMARY OF THE INVENTION

When a pattern size of a photomask is 45 nm or less which is extremely minute, a photomask blank used for manufacturing such a photomask is required to have lower defectivity (higher quality). Thus, when a silicon-based material film is formed using a target of a silicon-based material in which particles are easily generated during sputtering in manufacturing the photomask blank, a technique for suppressing defects caused by the particles more effectively is desired.

The present invention has been made in view of such a problem. An object of the present invention is to provide a silicon target material in which particles are not easily generated during a sputtering process and to provide a lower-defect (high quality) silicon-containing film formed using the same.

To solve the above-described problem, a target material for sputtering according to an aspect of the invention includes a silicon target material used for forming a silicon-containing material in which a specific resistance of the silicon target material is 20 Ω·cm or more at room temperature.

It is preferred that the conductivity of the silicon target material is n-type. It is also preferred that the silicon target material is single-crystalline. For example, the silicon target material may be a single-crystal silicon in which crystals are grown by an FZ method.

According to another aspect of the present invention, a method for forming a silicon-containing film includes forming the silicon-containing film by a sputtering method using a silicon target material having a specific resistance of 20 Ω·cm or more at room temperature.

It is preferred that the conductivity of the silicon target material is n-type. It is also preferred that the silicon target material is single-crystalline. The silicon-containing film may be formed in an atmosphere containing reactive gas containing at least one of oxygen and nitrogen. Preferably, the sputtering method is a DC sputtering method.

A photomask blank according to a further aspect of the present invention includes the silicon-containing film formed by the method as described above.

The silicon-containing film is formed by sputtering using the silicon target material having the specific resistance of 20

Ω·cm or more at room temperature according to the present invention. Therefore, the discharge characteristics are improved during a film formation process, and thus the number of particle defects in the silicon-containing film is reduced.

Thus, a low-defect and high-quality silicon-containing film can be provided to be usable as a light-shielding film or a phase shift film of a photomask blank.

DETAILED DESCRIPTION OF THE PREFERRED EMBODIMENTS

Particles are generated during sputtering using a silicon target material usually because of arc discharge on a target. In this regard, Japanese Patent Laid-Open No. 2003-322955 discloses that, when the conductivity of the target is small, the voltage is not easily applied on the surface of the target and the discharge becomes unstable, so that arc discharge is easily generated on the target and thus particles are easily generated. In the invention disclosed in Japanese Patent Laid-Open No. 2003-322955, a silicon target having a specific resistance of 0.1 Ω·cm or less is used for reducing the occurrence of such particles.

To pursue the further reduction of defects in an optical film caused by particles generated in a sputtering process, the inventors have found out that a silicon-containing film having low defects caused by the particles can be obtained by using a silicon target of high resistance (low conductivity) contrary to the invention disclosed in Japanese Patent Laid-Open No. 2003-322955 in which a silicon target of low resistance (high conductivity) having a specific resistance of 0.1 Ω·cm or less is used.

According to the present invention, a sputtering target material having relatively high resistance (low conductivity) and having a specific resistance of 20 Ω·cm or more at room temperature is used as a silicon target material used for forming a silicon-containing film. In other words, according to the present invention, a specific resistance is selected contrary to the idea disclosed in Japanese Patent Laid-Open No. 2003-322955 in which the occurrence of particles is reduced by suppressing the arc discharge generated due to high resistance of the target material surface. By forming a film using a sputtering target material of a specific resistance of 20 Ω·cm or more at room temperature, a silicon-containing film having low particle defects can be obtained as described later.

It is preferred that such a silicon target material has n-type conductivity in which a small amount of a donor element such as phosphorus and arsenic in view of discharge stability. When a single-crystalline is used as the silicon target material, the occurrence of particles is suppressed effectively because a grain boundary is not included. Especially, a single-crystal silicon in which crystals are grown by an FZ method has an extremely small content of oxygen, and is suitable as a silicon target material of the present invention.

A silicon-containing film of the present invention will be described below as an optical film for constituting a photomask blank. However, the present invention is not limited thereto.

For example, the silicon-containing film is used as a phase shift film or a light-shielding film of the photomask blank. Here, the light-shielding film means an optical film in which a light transmitting an area where the light-shielding film is provided does not substantially contribute to an exposure light when being used as a photomask. Thus, a total of the optical concentration for an exposure light of a light absorbing film formed on a transparent substrate is 2.0 or more, more typically 2.5 or more.

For example, such a silicon-containing film includes a stand-alone silicon film or film containing silicon, oxygen, and nitrogen as main components. The silicon-containing film is formed by reactive sputtering of a target material containing a silicon atom in an atmosphere containing reactive gas to which oxygen and nitrogen are added as necessary. As the sputtering method, a DC sputtering method by which the occurrence of particles is reduced and a high-quality film is easily obtained is preferably used.

As the target material used for forming the silicon-containing film, a target material of a stand-alone silicon (silicon target material) or a target material of a silicon-based material containing a transition metal may be used in accordance with the composition of the silicon-containing film.

A silicon target material which does not substantially contain a transition metal is used not only when the silicon-containing film which does not contain the transition metal is formed, but also when a content ratio of the transition metal relative to silicon is changed in the depth direction of the film or when a content ratio of the transition metal relative to silicon is extremely low.

In the leading-edge lithography method for semiconductor processing, an ArF excimer laser is used as an exposure light. To ensure a transmission required for a phase shift film in a wavelength area of the exposure light, a material having a content ratio of a transition metal which is lower than a conventionally-used transition metal-containing silicon material is needed to form the film. A chromium-based material is conventionally used as a material for a light-shielding film. However, it has becoming obvious that a silicon-based material is superior in light of the light-shielding property and processing performance. Also, it has been known that the chemical resistant property is improved as a content ratio of silicon is higher.

Under such circumstances, the need for using a stand-alone silicon target material (silicon target material) has been increased when a silicon-containing film is formed by sputtering.

However, when the film is formed by reactive sputtering in accordance with the DC sputtering method using the stand-alone silicon target material (silicon target material), the discharge becomes unstable due to the low conductivity of the target material and abnormal discharge is easily occurred. It has been known that the silicon-containing film formed in such a discharge state contains many defects caused by particles (particle defects). For such reasons, in the invention disclosed in Japanese Patent Laid-Open No. 2003-322955, the film stability and the occurrence of particles are reduced to improve the productivity by using the silicon target material (having a low resistance) of which the conductivity is enhanced by adding impurities such as a donor and an acceptor.

The inventors has confirmed the following fact in the process of studying a silicon-containing film having low particle defects formed by DC sputtering using a silicon target material. Firstly, when a silicon target material having a specific resistance of 1 Ω·cm or less is used, the stable discharge is easily obtained and the abnormal discharge is not easily occurred as described in a conventional report. When a silicon target material having a specific resistance of around 15 Ω·cm is used, the stable discharge is extremely difficult to be obtained. When the specific resistance is higher than 15 Ω·cm, the discharge characteristics is improved. When the specific resistance is 20 Ω·cm or more, the number of particle defects in the formed silicon-containing film is reduced.

When the specific resistance of the silicon target material is 50 Ω·cm or more, the number of particle defects is remarkably reduced.

The reason why the number of particle defects is reduced by using the silicon target material having a high specific resistance is not fully clarified. However, the inventors estimate the reasons as follows.

During a sputtering film formation process, high-energy particles (plasma) are irradiated to a target. When the high-energy particles collide with semiconductor crystals such as silicon, carriers (electrons and holes) are generated. Thus, in forming a film by sputtering using a silicon target, carriers are generated in the target.

The generated carriers are moved (diffused) in the target due to the applied voltage. When the diffused carriers collide with silicon crystal gratings, carriers are further generated. Since carries are repeatedly generated as described above, the number of carriers is gradually increased.

A distance where the carriers generated once are diffused in the silicon crystals becomes longer as the concentration of impurities contained in the target material is lower. Accordingly, the carriers are remarkably increased as the specific resistance of the silicon target material is higher. Consequently, the silicon target material having a high specific resistance has relatively high conductivity in the plasma, and thus the abnormal discharge is not easily occurred.

On the other hand, a silicon target material having a low specific resistance contains a relatively large amount of impurities such as boron (B) serving as an acceptor and phosphorus (P) serving as a donor in silicon crystals. Therefore, the conductivity is enhanced by carriers generated due to these impurities, and thus the discharge stability is improved.

However, the surface of the silicon target material having the low specific resistance easily reacts with reactive gas in an atmosphere. Thus, a film having a high resistance such as an oxide film is easily formed on the surface of the target to be relatively thick.

To the contrary, the surface of the silicon target having the relatively high specific resistance according to the present invention does not easily react with the reactive gas in the atmosphere. Even when the film having the high resistance such as the oxide film is formed on the surface of the target, its thickness is relatively thin. Accordingly, the stable discharge state can be easily maintained until termination of sputtering film formation. The above-described mechanism is merely on the basis of the speculation of the inventors. Thus, the present invention is not limited thereto.

The silicon target material according to the present invention may be polycrystalline or noncrystalline. However, when the silicon target material is single-crystalline, a more stable discharge state can be provided because there is no crystal grain boundary. Also, a single-crystal silicon in which crystals are grown by the FZ method is a preferable material as a highly-pure silicon target material because its content of oxygen is low.

The silicon target material according to the present invention has a relatively high specific resistance, the concentration of a dopant contained in silicon is low. Therefore, as long as the specific resistance is 20 Ω·cm or more, the advantageous effects of the present invention are not impaired depending on the type (conductivity type) and the concentration (conductivity) of the dopant. However, in order to obtain the stable discharge characteristics, an n-type dopant containing donor impurities is preferable.

A single or a plurality of silicon target materials according to the present invention are used for sputtering film formation of the silicon-containing film. Instead, a silicon target material and a target material containing a transition metal and silicon may be simultaneously used, or a silicon target material and a transition metal target material may be simultaneously used.

When the silicon target material and the target material containing the transition metal and silicon are simultaneously used, the composition of the latter target material may be appropriately selected depending on the composition of a target film. At this time, the transition metal does not required to be one type. When a plurality of types of transition metals are contained, the content ratio of each transition metal and silicon may be different for every transition metal. Such a target material is usually manufactured by a sintering method.

For example, the transition metal contained in the target material for forming the light-shielding film or the phase shift film may be titanium, vanadium, cobalt, nickel, zirconium, niobium, molybdenum, hafnium, tantalum, and tungsten. Molybdenum is preferable in view of dry etching processing characteristics of the obtained film.

The silicon-containing film according to the present invention is formed by the sputtering method using the above-described silicon target material having the specific resistance of 20 Ω·cm or more at room temperature. Such a silicon-containing film may be silicon oxide, silicon nitride, silicon oxynitride, transition metal silicon oxide, transition metal silicon nitride, and transition metal silicon oxynitride. Such a film may contain light elements such as carbon, helium, and hydrogen.

A ratio of the transition metal relative to the silicon contained in the silicon-containing film can be adjusted by the target material used for forming the film and the electric power applied to the target material. Also, a content of the light elements such as oxygen, nitrogen, and carbon can be controlled by adjustment of the later-described sputtering gas.

A composition of the silicon-containing film according to the present invention can be appropriately adjusted by a function of the target film. A preferred composition of a film having a high light-shielding function in the light-shielding film consists essentially of 10 atom % or more and 95 atom % or less, specifically 30 atom % or more and 95 atom % or less of silicon, 0 atom % or more and 50 atom % or less, specifically 0 atom % or more and 30 atom % or less of oxygen, 0 atom % jor more and 40 atom % or less, specifically 0 atom % or more and 20 atom % or less of nitrogen, 0 atom % or more and 20 atom % or less, specifically 0 atom % or more and 5 atom % or less of carbon, and 0 atom % or more and 35 atom % or less, specifically 1 atom % or more and 20 atom % or less of transition metal.

A preferred composition of a film having an antireflection function in the light-shielding film consists essentially of 10 atom % or more and 80 atom % or less, specifically 30 atom % or more and 50 atom % or less of silicon, 0 atom % or more and 60 atom % or less, specifically 0 atom % or more and 40 atom % or less of oxygen, 0 atom % or more and 57 atom % or less, specifically 20 atom % or more and 50 atom % or less of nitrogen, 0 atom % or more and 20 atom % or less, specifically 0 atom % or more and 5 atom % or less of carbon, and 0 atom % or more and 35 atom % or less, specifically 1 atom % or more and 20 atom % or less of transition metal.

A preferred composition of a film functioning as a phase shift film for absorbing light consists essentially of 10 atom % or more and 95 atom % or less, specifically 20 atom % or more and 95 atom % or less of silicon, 0 atom % or more and 60 atom % or less, specifically 0 atom % or more and 40 atom % or less of oxygen, 0 atom % or more and 50 atom % or less, specifically 0 atom % or more and 40 atom % or less of nitrogen, 0 atom % or more and 20 atom % or less, specifically 0 atom % or more and 5 atom % or less of carbon, and 0 atom % or more and 35 atom % or less, specifically 1 atom % or more and 20 atom % or less of transition metal.

The present invention is not specifically restricted relating to the sputtering method. However, the DC sputtering is preferable. The DC sputtering may be DC sputtering or pulsed DC sputtering.

The silicon-containing film according to the present invention is formed by reactive sputtering, for example, in an atmosphere containing reactive gas containing at least one of oxygen and nitrogen using the silicon target material having the specific resistance of 20 $\Omega \cdot cm$ or more at room temperature. For example, the gas containing oxygen may be oxygen gas, nitric oxide gas (the oxidation number of nitrogen is not specifically limited), carbon monoxide gas, and carbon dioxide gas. The gas containing nitrogen may be nitrogen gas, nitric oxide gas (the oxidation number of nitrogen is not specifically limited), and ammonia gas. Inert gas such as argon, xenon, and helium may be simultaneously used with these gases.

The sputtering gas is appropriately adjusted to obtain the composition of the target film and the discharge stability. For example, a preferred range of gas pressure is 0.01 Pa to 10 Pa.

The photomask blank according to the present invention includes the above-described silicon-containing film according to the present invention as an optical film such as a light-shielding film and a phase shift film. The silicon-containing film according to the present invention is effective as an auxiliary film such as a hard mask film for highly accurate etching processing of the light-shielding film and an etching stopper film provided between a transparent substrate and the light-shielding film.

Contrary to the conventional silicon target material, the resistance of the silicon target material according to the present invention is selected to be relatively high. When the sputtering film formation is performed using such a silicon target material, the occurrence of particles is suppressed and thus a low-defect silicon-containing film can be obtained. Such a silicon-containing film with high quality can be used as an optical film for constituting the photomask blank and also used for other various purposes.

EXAMPLE 1

Four substrates for a quart photomask having a 152 mm square were prepared, and a MoSiON film (Mo:Si:O:N=1:4:1:4) having the film thickness of 76 nm was formed on each substrate by the DC sputtering method. A single-crystal silicon target material having the n-type conductivity and having the specific resistance of 60 $\Omega \cdot cm$ at room temperature and a MoSi sintering target material (Mo:Si=1:2) were used as a target. In addition, argon gas, nitrogen gas, and oxygen gas were used as sputtering gas.

Defects of the MoSiON film obtained as described above were measured by Magics2351 (registered trademark) manufactured by Lasertec. The number of the defects having 0.2 μm or more is eight on average per one film formation substrate.

EXAMPLE 2

Under the same film formation condition as in Example 1 except that a single-crystal silicon having the n-type conductivity and having the specific resistance of 200 $\Omega \cdot cm$ at room temperature was used as the silicon target material, a MoSiON film was formed on each of four substrates for photomask. When defects were measured after forming the film similarly to Example 1, the number of the defects having 0.2 μm or more is six on average per one film formation substrate.

COMPARISON 1

Under the same film formation condition as in Example 1 except that a polycrystalline silicon having the p-type conductivity and having the specific resistance of 0.001 $\Omega \cdot cm$ at room temperature was used as the silicon target material, a MoSiON film was formed on each of four substrates for photomask. When defects were measured after forming the film similarly to Example 1, the number of the defects having 0.2 μm or more is 21 on average per one film formation substrate.

COMPARISON 2

Under the same film formation condition as in Example 1 except that a single-crystal silicon having the p-type conductivity and having the specific resistance of 15 $\Omega \cdot cm$ at room temperature was used as the silicon target material, a MoSiON film was formed. The stable discharge was not obtained from the silicon target material.

The silicon-containing film is formed by sputtering using the silicon target material having the specific resistance of 20 $\Omega \cdot cm$ or more at room temperature according to the present invention. Therefore, the discharge characteristics are improved during the film formation process, and thus the number of particle defects in the silicon-containing film is reduced. Thus, the low-defect and high-quality silicon-containing film can be provided to be usable as the light-shielding film or the phase shift film of the photomask blank.

What is claimed is:

1. A method for producing a photomask blank, comprising forming a silicon-containing film by a DC sputtering method using a silicon target material having a specific resistance of 20 $\Omega \cdot cm$ or more at room temperature.

2. The method for producing a photomask blank according to claim 1, wherein conductivity of said silicon target material is n-type.

3. The method for producing a photomask blank according to claim 2, wherein said silicon target material is single-crystalline.

4. The method for producing a photomask blank according to claim 3, wherein said silicon target material is a single-crystal silicon in which crystals are grown by an FZ method.

5. A photomask which is fabricated using a photomask blank produced by a method according to claim 1.

* * * * *